US006972253B2

(12) United States Patent
Liu et al.

(10) Patent No.: US 6,972,253 B2
(45) Date of Patent: Dec. 6, 2005

(54) METHOD FOR FORMING DIELECTRIC BARRIER LAYER IN DAMASCENE STRUCTURE

(75) Inventors: Ai-Sen Liu, Hsinchu (TW); Syun-Ming Jang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 63 days.

(21) Appl. No.: 10/657,847

(22) Filed: Sep. 9, 2003

(65) Prior Publication Data

US 2005/0051900 A1   Mar. 10, 2005

(51) Int. Cl.$^7$ .......................................... H01L 21/4763
(52) U.S. Cl. ...................... 438/627; 438/634; 438/740; 438/756
(58) Field of Search ................................ 438/618–651, 438/780, 781, 758, 759, 691, 692; 257/77, 257/751, 760, 767, 774

(56) References Cited

U.S. PATENT DOCUMENTS

| | | | |
|---|---|---|---|
| 3,510,369 A * | 5/1970 | Kisinko et al. ............. | 438/551 |
| 5,818,071 A | 10/1998 | Loboda et al. | |
| 6,429,121 B1 | 8/2002 | Hopper et al. | |
| 6,436,824 B1 | 8/2002 | Chooi et al. | |
| 6,465,366 B1 | 10/2002 | Nemani et al. | |
| 6,465,889 B1 | 10/2002 | Subramanian et al. | |
| 6,468,897 B1 | 10/2002 | Cheng et al. | |
| 6,475,913 B1 | 11/2002 | Kim | |
| 6,528,423 B1 | 3/2003 | Catabay et al. | |
| 6,577,009 B1 * | 6/2003 | You et al. ................... | 257/751 |
| 6,723,634 B1 * | 4/2004 | Ngo et al. .................. | 438/627 |
| 6,790,788 B2 * | 9/2004 | Li et al. ..................... | 438/778 |

* cited by examiner

Primary Examiner—Amir Zarabian
Assistant Examiner—Khanh Duong
(74) Attorney, Agent, or Firm—Haynes and Boone, LLP (57) ABSTRACT

A method for fabricating dielectric barrier layers in integrated circuit structures such as damascene structures is provided. In one embodiment, a low-k dielectric layer formed on a substrate is provided. The low-k dielectric layer has at least one opening exposing an underlying metal layer. A first silicon carbide barrier layer is formed to conformally cover the exposed surfaces of the opening. A portion of the first silicon carbide barrier layer above the low-k dielectric layer and over the bottom of the opening is converted with an oxidation treatment into a layer of silicon oxide. The silicon oxide layer is removed above the low-k dielectric layer and from the bottom of the opening. The opening is filled with a conductive layer in electrical contact with the underlying metal layer. The conductive layer is removed above the low-k dielectric layer to a predetermined depth below the low-k dielectric layer to define a recess therebelow. A second silicon carbide barrier layer is formed to cover the recess and above the low-k dielectric layer and the first silicon carbide barrier layer so as to seal the top of the structure. A portion of the second silicon carbide barrier layer above the low-k dielectric layer is converted with an oxidation treatment into a layer of silicon oxide. The layer of silicon oxide is then removed and the metal conductive layer is fully encapsulated by the silicon carbide barrier layer.

54 Claims, 7 Drawing Sheets

METHOD FOR FORMING DIELECTRIC BARRIER LAYER IN DAMASCENE STRUCTURE

BACKGROUND

The present invention relates generally to the formation of integrated circuit structures, and particularly, but not by way of limitation, to methods for forming damascene structures within microelectronic fabrications. More particularly, the present invention relates to methods for forming dielectric barrier layers in damascene structures.

As integrated circuit geometries continue to shrink down into the sub-micron region, the demands for dimensional accuracy become increasingly difficult to satisfy. Moreover, with the increasing demands for high performance associated with ultra large-scale integration (ULSI) semiconductor devices, the interconnection technology is constantly challenged. As integrated circuits become complex and feature sizes and spacings become smaller, the integrated circuit speed becomes less dependent upon the transistor itself and more dependent upon the interconnection pattern.

Conventional semiconductor devices include a substrate and a plurality of sequentially formed interlayer dielectrics and metal layers. Typically, the metal layers on different levels, i.e., upper and lower levels, are electrically connected by metal plugs filling via holes, while metal plugs filling contact holes establish electrical contact with active regions on a substrate, such as a source/drain region. Metal lines are formed in trenches which typically extend substantially horizontal with respect to the substrate. High performance microprocessors use metal lines to interconnect tens of millions of devices on one chip. To make electrical connections in today's advanced microchips, six or more conducting metal layers are often used as wafers progress to higher density chips with shrinking geometries of 0.13 $\mu$m and below.

Reducing chip performance signal delays caused by interconnect lines was not a significant concern for older integrated circuit (IC) technologies. The dominant signal delay has traditionally been caused by the device. However, for newer ULSI products manufactured with denser wiring, signal delay due to interconnect has become a larger portion of the clock cycle time and has more effect on limiting the IC performance. Moreover, when the distance between adjacent metal interconnects and/or the thickness of the insulating material has sub-micron dimensions, parasitic coupling potentially occurs between such interconnects. Parasitic coupling between adjacent metal interconnects may cause cross talk and/or resistance-capacitance (RC) delay which degrades the overall performance of the integrated circuit. Advanced metallization technology is therefore, critical for increasing performance in advanced ICs.

One example of an advanced metal interconnect process is a process known as damascene. In a damascene process, an opening is formed in an interlayer dielectric (ILD) layer overlying a metal layer and the opening is filled with a conductive material, typically a metal such as copper. In a dual damascene process, an opening in an ILD layer comprising a lower via hole section in communication with an upper trench section is filled with a conductive material, typically a metal such as copper, to simultaneously form a lower contact or via in electrical contact with a metal layer, and using chemical mechanical planarization (CMP) the excess copper is removed. After many years of developmental activities, the semiconductor industry is implementing copper as the interconnect material for microchip fabrication and the dual damascene process became the consensus process for copper metallurgy.

Although the damascene process is an important step forward in forming viable copper interconnects, it does have problems associated with it which must be addressed. Copper has been found to contaminate many of the materials used in integrated circuit fabrications. It diffuses/drifts easily into adjoining interlayer dielectric layers causing damage to neighboring devices on the semiconductor substrate. Several methods have been developed, however, to provide containment of copper deposited as conducting wires and interconnects. Chief among these is the prior formation of barrier layers within the trenches and vias into which the copper is subsequently deposited.

Conventional metal barrier layers made of materials such as tantalum (Ta), tantalum nitride (TaN), and tantalum silicon nitride (TaSiN) can prevent possible interaction between copper interconnect and the ILD and also provide adhesion therebetween. However, the barrier layer may itself be subject to degradation from surrounding materials. Moreover, the barrier layer may exhibit poor adhesion by not adhering well to the copper or to the surrounding material. Furthermore, the barrier layer may be difficult to fabricate with the requisite thinness in lining trenches and vias of dimensions less than 0.13 microns. Additionally, the barrier layer may have high bulk resistivity for reliable ohmic contact to shallow junctions. Still further, the barrier layer may be subject to the outgassing phenomenon. Outgassing is a critical issue for low-k interlayer dielectric and barrier layers. It degrades the adhesion between the sandwiched structures of the low-k interlayer dielectric layer, the barrier layer, and the copper layer leading to their delamination and negatively impacting the thermal reliability/mechanical strength of the damascene structure.

For these reasons and other reasons that will become apparent upon reading the following detailed description, there is a need for an improved method of forming dielectric barrier layers in damascene structures that avoids the reliability and IC performance problems associated with conventional methods of forming barrier layers.

SUMMARY

The present invention is directed to methods for fabricating dielectric barrier layers with enhanced reliability in integrated circuit structures, such as damascene structures. In one embodiment, a low-k dielectric layer formed on a substrate is provided; the low-k dielectric layer has at least one opening exposing an underlying metal layer. A first silicon carbide barrier layer is formed to conformally cover the exposed surfaces of the opening. A portion of the first silicon carbide barrier layer above the low-k dielectric layer and over the bottom of the opening is converted with an oxidation treatment into a layer of silicon oxide. The silicon oxide layer is then removed above the low-k dielectric layer and from the bottom of the opening. The opening is filled with a conductive layer in electrical contact with the underlying metal layer. The conductive layer is removed above the low-k dielectric layer to a predetermined depth below the low-k dielectric layer to define a recess therebelow. A second silicon carbide barrier layer is formed to cover the recess and above the low-k dielectric layer and the first silicon carbide barrier layer so as to completely encapsulate the conductive layer. A portion of the second silicon carbide barrier layer above the low-k dielectric layer is converted with an oxidation treatment into a layer of silicon oxide. The layer of silicon oxide is then removed.

In another embodiment, a first low-k dielectric layer formed on a substrate is provided; the first low k-dielectric layer has at least one opening having a via hole which exposes an underlying metal layer surrounded by the first low-k dielectric layer, the first low-k dielectric layer has an etch stop layer formed thereupon, and a trench over the via hole surrounded by a second low-k dielectric layer. A first silicon carbide barrier layer is formed to conformally cover the exposed surfaces of the opening. A portion of the first silicon carbide barrier layer above the second low-k dielectric layer, the etch stop layer, and over the bottom of the via hole is converted with an oxidation treatment into a layer of silicon oxide. The silicon oxide layer is then removed above the second low-k dielectric layer and the etch stop layer, and from the bottom of the via hole. The via hole and the trench is filled with a conductive layer in electrical contact with the underlying metal layer. The conductive layer is removed above the second low-k dielectric layer to a predetermined depth below the second low-k dielectric layer to define a recess therebelow. A second silicon carbide barrier layer is formed to cover the recess and above the second low-k dielectric layer and the first silicon carbide barrier layer so as to completely encapsulate the conductive layer. A portion of the second silicon carbide barrier layer above the second low-k dielectric layer is converted with an oxidation treatment into a layer of silicon oxide. The layer of silicon oxide is then removed.

In another embodiment, a carbon-doped silicon oxide dielectric layer is provided over a substrate. A silicon carbide-based barrier layer covers exposed surfaces of the carbon-doped silicon oxide dielectric layer and a portion of the silicon carbide-based barrier layer is converted with an oxidation treatment into a layer of silicon oxide. The carbon-doped silicon oxide dielectric layer can be used a stop layer to remove the layer of silicon oxide.

In another embodiment, a semiconductor device is fabricated by providing a silicon carbide-based barrier layer on a substrate and converting a portion of the silicon carbide-based barrier layer with an oxidation treatment into a layer of silicon oxide.

BRIEF DESCRIPTION OF THE DRAWINGS

The features, aspects, and advantages of the present invention will become more fully apparent from the following detailed description, appended claims, and accompanying drawings in which:

DETAILED DESCRIPTION

In the following description, numerous specific details are set forth to provide a thorough understanding of the present invention. However, one having an ordinary skill in the art will recognize that the invention can be practiced without these specific details. In some instances, well-known circuits, structures and processes have not been shown in detail to avoid unnecessarily obscuring the present invention.

Reference will now be made in detail to the present preferred embodiments of the present invention, examples of which are illustrated in the accompanying drawings.

Figure 1:
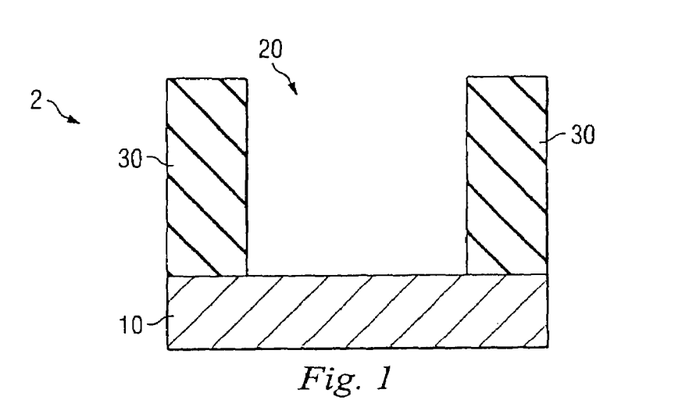
FIG. 1 is a schematic cross-sectional view of a formation of an integrated circuit structure showing a low-k dielectric layer formed on a substrate, the low-k dielectric layer has at least one opening exposing an underlying metal layer. The opening may be a single damascene opening, contact opening, via hole or trench and is formed by any one of several conventional patterning and etching schemes according to one embodiment of the present invention.

FIGS. 1 through 9 illustrate schematic cross-sectional views of a formation of an integrated circuit structure, by way of example, but not by way of limitation, according to one embodiment of the present invention. As shown in FIG. 1, an integrated circuit structure 2 having an opening 20 formed in a low-k dielectric layer 30 overlying a substrate 10 is provided. It is understood that type of the integrated circuit structure 2 is a design choice dependent on the fabrication process being employed. For instance, integrated circuit structure 2 may be a metal interconnect structure as employed in the fabrication of metal lines and plugs of integrated circuits. In one embodiment, the integrated circuit structure 2 is a damascene structure.

Low-k dielectric layer 30 may include any suitable dielectric material conventionally employed in the manufacture of semiconductor devices, including low-k materials having a dielectric constant of about 3.0 or less to insulate one conductive layer from another. Preferably, low-k dielectric layer 30 includes carbon-doped silicon oxide (SiOC). Carbon-doped silicon oxide is a suitable low k material for use in damascene integration because it exhibits a low dielectric constant of about 2.2 to 2.8, it is structurally more reliable than other low-k materials in microelectronic fabrication, and it cannot be dissolved by hydrofluoric acid (HF) wet etching in a subsequent etching step.

The substrate 10 may include a substrate as employed within the microelectronic fabrication, wherein the substrate has formed thereupon and/or thereover any of several additional microelectronic layers as are conventionally employed within the microelectronic fabrication. These layers may include, for example, conductor materials, semiconductor materials and dielectric materials. In one embodiment, opening 20 exposes an underlying metal layer (not shown) for electrical contact with a subsequently formed conductive plug in opening 20. It is understood that the type of underlying metal layer is a design choice dependent on the fabrication process being employed.

Opening 20 can be a single damascene opening, a contact opening, a via hole, or a trench according to design requirements. Opening 20 is formed by any one of several conventional patterning and etching schemes, and maybe formed, for example, by forming a patterned photoresist layer (not shown) over dielectric layer 30 and performing a plasma etching operation. The etching chemistry for the plasma etching process may include one or more of the following chemicals: fluorocarbons, hydrocarbons, fluorine substituted hydrocarbons, fluorosulfurs, chlorine, hydrogen bromide, oxygen, nitrogen, argon, hydrogen and carbon monoxide, wherein the choice of chemistries is tailored appropriately to design parameters.

Figure 2:
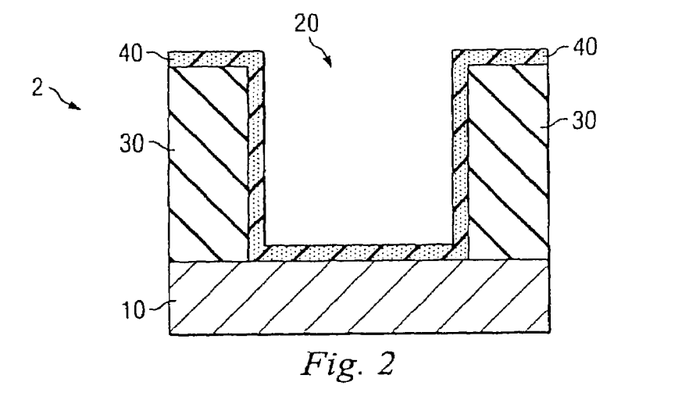
FIG. 2 is a schematic cross-sectional view of the structure of FIG. 1 showing a first barrier layer of silicon carbide formed to conformally cover the exposed surfaces of the opening according to one embodiment of the present invention.

FIG. 2 shows a schematic cross-sectional view of the structure of FIG. 1 showing a first barrier layer of silicon carbide material 40 formed over the exposed surfaces of opening 20. One advantage in employing silicon carbide as a barrier layer is that it can be readily used to conformally line trenches and vias of dimensions less than 0.13 microns thereby forming interconnect patterns having high dimensional accuracy. Moreover, silicon carbide material has a dielectric constant of less than about 3.0, so as to prevent or minimize parasitic coupling between metal interconnects and it has low leakage and high breakdown performance. Further, first silicon carbide barrier layer 40 can be used to encapsulate a subsequently formed conductive layer, such as copper or copper alloy, from the surrounding low-k dielectric layer 30 thereby preventing diffusion of the metal into the dielectric layer. Further still, the use of silicon carbide as a barrier layer can enhance the adhesion between the conductive layer and the surrounding low-k dielectric layer.

First silicon carbide barrier layer 40 conformally lines all the exposed surfaces of opening 20. The methods of applying silicon carbide layers are not critical to the present invention and many are well known in the art and widely practiced. Examples of applicable methods include a variety of chemical vapor deposition techniques such as conventional CVD, photochemical vapor deposition, plasma enhanced chemical vapor deposition (PECVD), electron cyclotron resonance (ECR), jet vapor deposition, etc. and a variety of physical vapor deposition techniques such as sputtering, electron beam evaporation, etc. These processes involve either the addition of energy (in the form of heat and plasma, for example) to a vaporized species to cause the desired reaction or the focusing of energy on a solid sample of the material to cause its deposition.

In one embodiment, the first silicon carbide barrier layer 40 is thick enough to perform its diffusion inhibition function yet thin enough to conformally line damascene openings, contact openings, trenches, vias, or otherwise openings of dimensions less than 0.13 microns. In one embodiment of the present invention, first silicon carbide barrier layer 40 is conformally deposited along the exposed surfaces of substrate 10 and low-k dielectric layer 30 to a thickness of about 200 angstroms to about 400 angstroms at a temperature of from about 350° C. to about 450° C. using one of CVD process and PECVD process.

Figure 3:
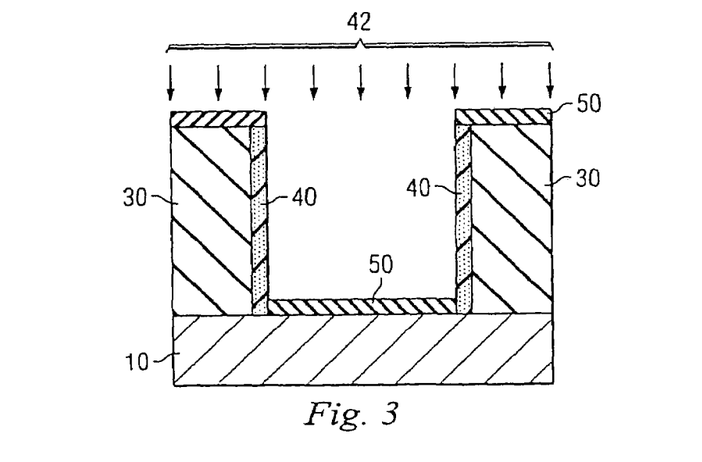
FIG. 3 is a schematic cross-sectional view of the structure of FIG. 2 showing the first barrier layer of silicon carbide exposed to a reactive oxidation treatment to form a layer of silicon oxide above the low-k dielectric layer and over the bottom of the opening according to one embodiment of the present invention.

Referring now to FIG. 3, a schematic cross-sectional view of the structure of FIG. 2 shows the first silicon carbide barrier layer 40 exposed to an oxidation treatment 42 to form layers of silicon oxide (SiOx) 50 above the low-k dielectric layer 30 and over the bottom of the opening 20. Conventional oxidation treatments may be employed and, in one embodiment, may include a reactive oxidation treatment performed at a temperature of from about 350° C. to about 450° C., at a pressure of from about 4.0 T to about 6.0 T, and a radio frequency power of from about 2000 W to about 3000 W. The reactive oxidation treatment exposes the first silicon carbide barrier layer 40 to an oxidative gas plasma containing gases such as O2, O3 and N2O. It is understood that the first silicon carbide barrier layer 40 formed on the sidewalls of the low-k dielectric layer 30 may not be converted to silicon oxide because there is no plasma reaction in the horizontal direction during the reactive oxidation process. The first silicon carbide barrier layer 40 formed on the sidewalls of the low-k dielectric layer 30 form part of the silicon carbide barrier structure that will completely encapsulate a later deposited conductive layer.

Figure 4:
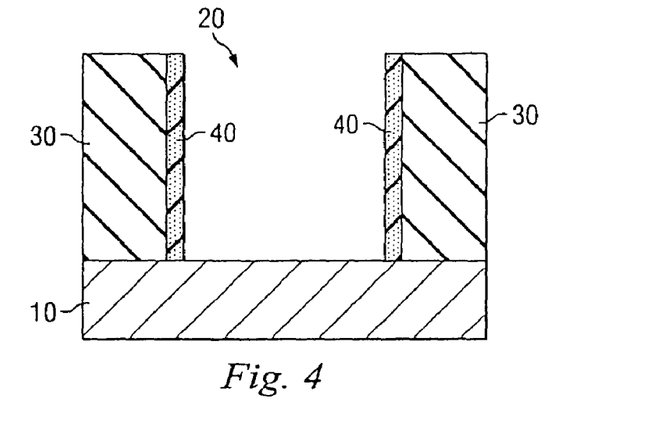
FIG. 4 is a schematic cross-sectional view of the structure of FIG. 3 after the silicon oxide layer is removed from above the low-k dielectric layer and from the bottom of the opening according to one embodiment of the present invention.

FIG. 4 is a schematic cross-sectional view of the structure of FIG. 3 after further processing. The silicon oxide layers 50 above the low-k dielectric layer 30 and at the bottom of the opening 20 are removed. Silicon oxide layers 50 are removed by a conventional etching process, such as an hydrofluoric acid (HF) wet etching solution prior to the filling of a conductive layer in opening 20.

Figure 5:
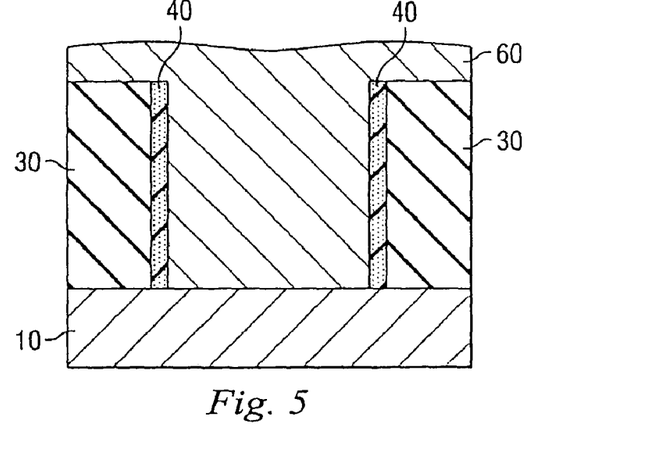
FIG. 5 is a schematic cross-sectional view of the structure of FIG. 4 showing the opening filled with a conductive layer of copper or copper alloy according to one embodiment of the present invention.

Turning now to FIG. 5, a schematic cross-sectional view of the structure of FIG. 4 shows the opening 20 filled with a conductive material to form conductive layer 60. Conductive layer 60 may be made from materials conventionally used to form conductive layers for semiconductor devices. Conductive layer 60 may include low resistivity metals such as, for example, copper (Cu), aluminum (Al), or aluminum alloy. In an embodiment of the present invention, opening 20 is filled with a layer of copper or copper alloy 60 in electrical contact with an underlying metal layer (not shown). As employed throughout this disclosure, copper alloys may contain minor amounts of metals such as, for example, tin, zinc, manganese, titanium, germanium, zirconium, strontium, palladium, magnesium, chromium, silver and tantalum. Copper or copper alloy layer 60 is deposited in opening 20 by, for example, electrochemical deposition (ECD), PVD, CVD, electro-plating technique, or a combination of these techniques to completely fill opening 20 and form an overburden. It is understood that how the conductive layer 60 is deposited is a design choice dependent on the fabrication process being employed. Next, a planarization process such as a conventional chemical-mechanical planarization (CMP) process may be conducted to remove the overburden.

Figure 6:
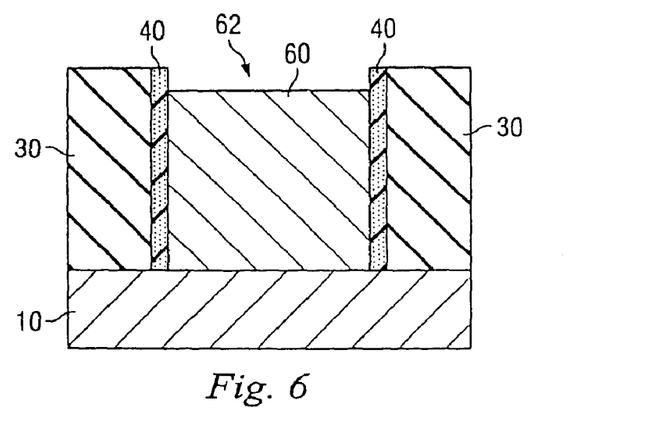
FIG. 6 is a schematic cross-sectional view of the structure of FIG. 5 showing the removal of the conductive layer above the low-k dielectric layer to a predetermined depth below the low-k dielectric layer to define a recess therebelow according to one embodiment of the present invention.

Referring to FIG. 6, a schematic cross-sectional view of the structure of FIG. 5 shows the removal of the conductive layer of copper or copper alloy 60 from above the low-k dielectric layer 30 to a predetermined depth below the low-k dielectric layer 30 to define a recess 62 therebelow. A significantly greater amount of conductive layer 60 may be removed, without simultaneously removing significant amounts of low-k dielectric layer 30 or first silicon carbide barrier layer 40, to form a relatively highly recessed conductive layer 60 within low-k dielectric layer 30.

There are many ways to remove additional amounts of conductive layer 60 without removing a substantial portion of low-k dielectric layer 30 or first silicon carbide barrier layer 40. The conductive layer 60 residing above opening 20 and below opening 20 may be removed by a conventional etching or polishing technique. In one embodiment of the present invention, a conventional CMP process is used to remove the conductive layer 60 using the low-k dielectric layer 30 and first silicon carbide barrier layer 40 as a polishing stop layer. In the CMP process, the low-k dielectric layer 30 has a high polishing selectivity ratio relative to the conductive layer 60, that is, the polishing rate of the low-k dielectric layer 30 is considerably lower than that of the conductive layer 60. The polishing step continues to remove the conductive layer 60 to a predetermined depth below the opening 20 to define recess 62 therebelow. By adjusting the parameters applied during the CMP process, a highly recessed conductive layer 60 may be formed.

The predetermined depth may be from about 300 angstroms to about 600 angstroms. A subsequently formed barrier layer will then be deposited in recess 62 to serve as a sealing layer so as to cover the top the of the integrated circuit structure 2. In the present embodiment, the conductive layer 60 is recessed sufficiently deep into low-k dielectric layer 30 to ensure that the subsequently deposited barrier layer will maintain a sufficient thickness to serve as a barrier layer and etch stop, even after the barrier layer has been polished and cleaned.

Figure 7:
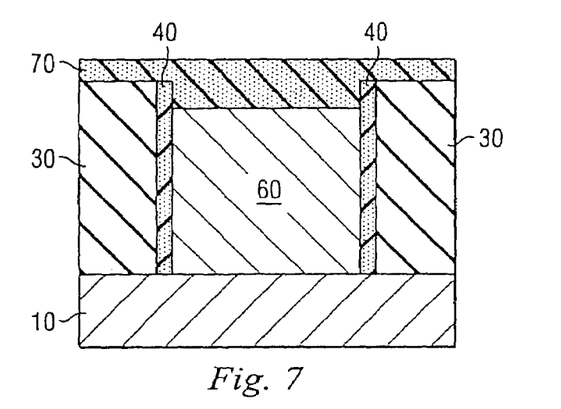
FIG. 7 is a schematic cross-sectional view of the structure of FIG. 6 showing a second barrier layer of silicon carbide formed to cover the recess and the upper surfaces of the low-k dielectric layer and the first barrier layer of silicon carbide according to one embodiment of the present invention.

FIG. 7 is a schematic cross-sectional view of the structure of FIG. 6 showing a second barrier layer of silicon carbide material 70 formed to cover the recess 62 and the upper surfaces of the low-k dielectric layer 30 and the first silicon carbide barrier layer 40. The second silicon carbide barrier layer 70 serves to completely encapsulate the inlaid conductive layer 60. As discussed with reference to FIG. 2, second silicon carbide barrier layer 70 may be formed by one of several conventional procedures that are well known by those in the art and widely practiced. In one embodiment, silicon carbide barrier layer 70 is formed using one of CVD process and PECVD process, formed at a thickness of about 200 angstroms to about 400 angstroms, at a temperature from about 350° C. to about 450° C. However, the thickness of silicon carbide barrier layer 70 is variable depending on the specific stage of processing. Typically, the silicon carbide barrier layer 70 has a thickness of from about 200 angstroms to about 400 angstroms.

Figure 8:
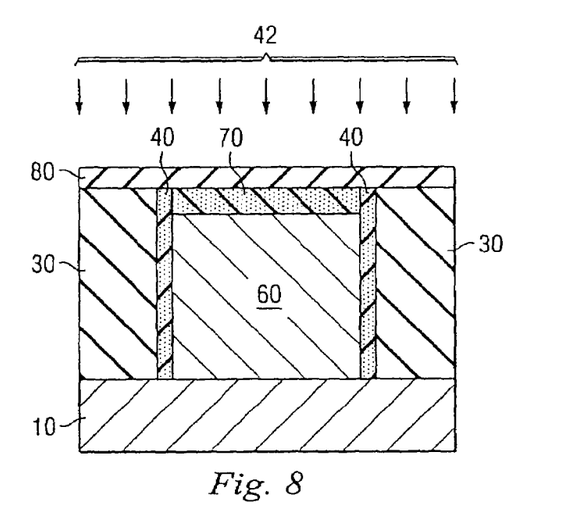
FIG. 8 is a schematic cross-sectional view of the structure of FIG. 7 showing the second barrier layer of silicon carbide exposed to a reactive oxidation treatment to form a layer of silicon oxide above the low-k dielectric layer according to one embodiment of the present invention.

Turning now to FIG. 8, a schematic cross-sectional view of the structure of FIG. 7 shows the second barrier layer of silicon carbide 70 exposed to an oxidation treatment 42 to form a layer of silicon oxide 80 above low-k dielectric layer 30. Conventional oxidation treatments may be employed and, in one embodiment, may include a reactive oxidation treatment performed at a temperature of from about 350° C. to about 450° C., a pressure of from about 4.0 T to about 6.0 T, and a radio frequency power of from about 2000 W to about 3000 W.

Figure 9:
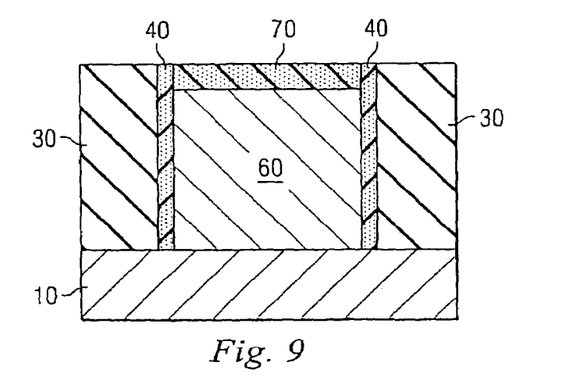
FIG. 9 is a schematic cross-sectional view of the structure of FIG. 8 showing the removal of the silicon oxide layer using an HF wet etching solution according to one embodiment of the present invention.

FIG. 9 is a schematic cross-sectional view of the structure of FIG. 8 showing the removal of the silicon oxide layer 80. Silicon oxide layer 80 can be removed by a conventional etching process, such as an hydrofluoric acid (HF) wet etching. In the resulting structure 2, first and second barrier layers of silicon carbide 40 and 70, respectively completely surround conductive layer 60. By repeating the above processes, additional interconnect structures can be fabricated to form metallization levels above structure 2. For instance, after forming a low-k dielectric layer above structure 2, a via (not shown) may be etched through it down to second silicon carbide barrier layer 70. The process steps described above may be repeated as necessary to generate a device with the desired number of metal levels.

Another embodiment of the present invention is schematically illustrated, by way of example, but not by way of limitation, in FIGS. 10 through 18.

Figure 10:
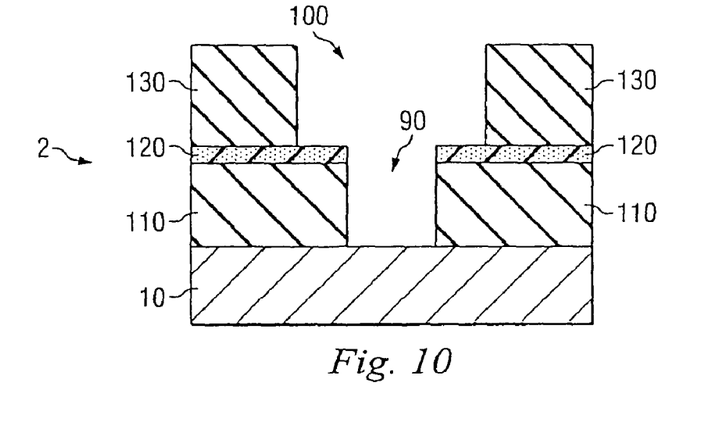
FIG. 10 is a schematic cross-sectional view of a formation of an integrated circuit structure showing a first low-k dielectric layer formed on a substrate having at least one opening, the opening has a via hole exposing an underlying metal layer surrounded by the first low-k dielectric layer, the first low-k dielectric layer has an etch stop layer formed thereupon, and a trench over the via hole surrounded by a second low-k dielectric layer. The via hole, etch stop layer, and trench are formed by any one of several conventional patterning and etching schemes according to one embodiment of the present invention.

FIG. 10 is a schematic cross-sectional view of a formation of an integrated circuit structure 2 showing a first low-k dielectric layer 110 formed on a substrate 10 having at least an opening with a via hole 90 surrounded by first low-k dielectric layer 110, first low-k dielectric layer 110 having an etch stop layer 120 formed thereupon, and a trench 100 over the via hole 90 surrounded by a second low-k dielectric layer 130. It is understood that the type of the integrated circuit structure 2 is a design choice dependent on the fabrication process being employed. In one embodiment, the integrated circuit structure 2 is a dual damascene structure having via hole 90 and trench 100 patterned and formed according to one of several conventional patterning and etching schemes, such as trench first, via first or a self-alignment (buried via) scheme. During formation of the dual damascene structure, an etch stop layer 120, at a thickness suitable to function as an etch stop layer, is formed and patterned by conventional processes on first low-k dielectric layer 110 to protect the upper surface of first low-k dielectric layer 110 during formation of trench 100. Furthermore, etch stop layer 120 also protects the underlying first low-k dielectric layer 110 in subsequent steps of forming a layer of silicon oxide on etch stop layer 120 and the removal of the silicon oxide layer by etching. Etch stop layer 120 may include any suitable etch stop material such as, for example, silicon nitride (SiN) or SiON. In an embodiment of the present invention, etch stop layer 120 includes silicon-carbide based material.

First low-k dielectric layer 110 and second low-k dielectric layer 130 may include any suitable dielectric material conventionally employed in the manufacture of semiconductor devices, including low-k materials having a dielectric constant of about 3.0 or less to insulate one conductive layer from another. Preferably, first low-k dielectric layer 110 and second low-k dielectric material 130 include carbon-doped silicon oxide (SiOC). Carbon-doped silicon oxide is a suitable low k material for use in dual damascene applications because it has a low dielectric constant of about 2.2 to 2.8, it is structurally more reliable than other low-k materials in microelectronic fabrication, and it cannot be dissolved by hydrofluoric acid (HF) wet etching in a subsequent etching step. Other materials that include one or more of these properties or similar properties may also be used.

Figure 11:
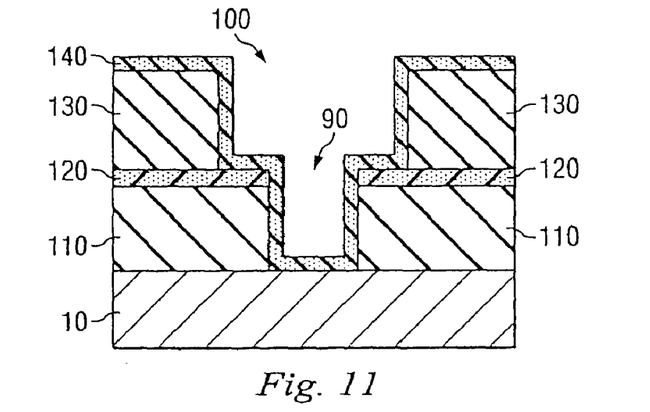
FIG. 11 is a schematic cross-sectional view of the structure of FIG. 10 showing a first barrier layer of silicon carbide formed to conformally cover the exposed surfaces of the opening according to one embodiment of the present invention.

Referring now to FIG. 11, a schematic cross-sectional view of the structure of FIG. 10 shows a first barrier layer of silicon carbide material 140 formed over the exposed surfaces of the via hole 90 and trench 100. First silicon carbide barrier layer 140 conformally lines all exposed surfaces of via hole 90 and trench 100. First silicon carbide barrier layer 140 is formed using conventional processes as described above with reference to FIG. 2. Preferably, first silicon carbide barrier layer 140 is thick enough to perform its diffusion inhibition function yet thin enough to conformally line trenches, vias, or otherwise openings of dimensions less than 0.13 microns. In one embodiment of the present invention, first silicon carbide barrier layer 140 is conformally deposited along the exposed surfaces of substrate 10, first low-k dielectric layer 110, second low-k dielectric layer 130, and etch stop layer 120 to a thickness of about 200 angstroms to about 400 angstroms at a temperature of from about 350° C. to about 450° C. using one of CVD process and PECVD process. The advantages in using silicon carbide as a barrier layer is described above with reference to FIG. 2.

Figure 12:
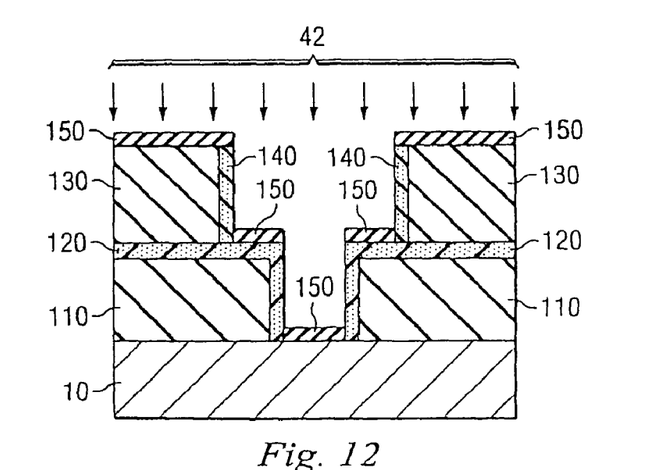
FIG. 12 is a schematic cross-sectional view of the structure of FIG. 11 showing the first barrier layer of silicon carbide exposed to a reactive oxidation treatment to form a layer of silicon oxide above the second low-k dielectric layer, the etch stop layer, and over the bottom of the via hole according to one embodiment of the present invention.

FIG. 12 is a schematic cross-sectional view of the structure of FIG. 11 showing the first barrier layer of silicon carbide 140 exposed to an oxidation treatment 42 to form a layer of silicon oxide 150 above the second low-k dielectric layer 130, the etch stop layer 120, and over the bottom of the via hole 90. Conventional oxidation treatments may be employed and, in one embodiment, may include a reactive oxidation treatment performed at a temperature of from about 350° C. to about 450° C., at a pressure of from about 4.0 T to about 6.0 T, and a radio frequency power of from about 2000 W to about 3000 W. The reactive oxidation treatment exposes the silicon carbide barrier layer 140 to an oxidative gas plasma containing gases such as O2, O3 and N2O. First silicon carbide barrier layer 140 formed on the sidewalls of the first low-k dielectric layer 110, the second low-k dielectric layer 130 and the etch stop layer 120 is not converted to silicon oxide because there is no plasma reaction in the horizontal direction during the reactive oxidation process. The first silicon carbide barrier layer 140 formed on the sidewalls of first and second low-k dielectric layers 110 and 130, respectively, form part of the silicon carbide barrier structure that will completely encapsulate a later deposited conductive layer.

Figure 13:
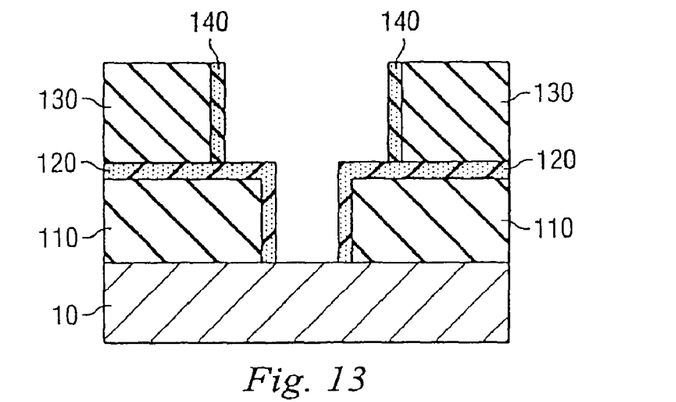
FIG. 13 is a schematic cross-sectional view of the structure of FIG. 12 after the silicon oxide layer is removed from above the second low-k dielectric layer and the etch stop layer, and from the bottom of the via hole using an HF wet etching solution according to one embodiment of the present invention.

FIG. 13 shows a schematic cross-sectional view of the structure of FIG. 12 after the silicon oxide layers 150 are removed from above the second low-k dielectric layer 130 and the etch stop layer 120, and from the bottom of the via hole 90. Silicon oxide layer 150 is removed by a conventional etching process, such as an hydrofluoric acid (HF) wet etching solution prior to the filling of a conductive layer in via hole 90 and trench 100. Etch stop layer 120 acts as an etch stop protecting the underlying first low-k dielectric layer 110 during the step of etching away the silicon oxide layer 150.

Figure 14:
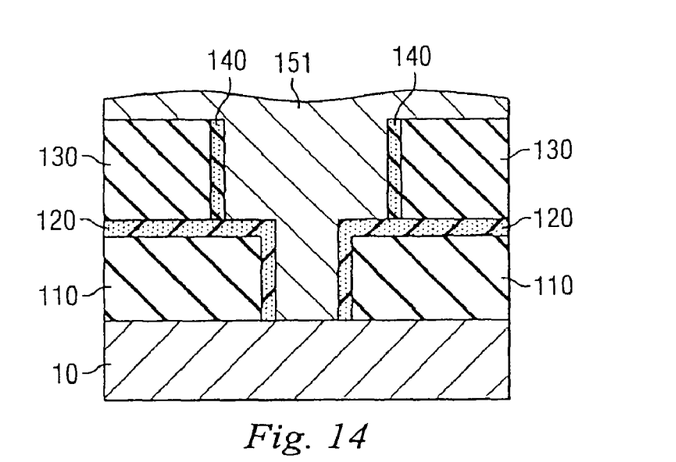
FIG. 14 is a schematic cross-sectional view of the structure of FIG. 13 showing the via hole and trench filled with a conductive layer of copper or copper alloy according to one embodiment of the present invention.

Referring now to FIG. 14, a schematic cross-sectional view of the structure of FIG. 13 shows the via hole 90 and trench 100 filled with a conductive material to form conductive layer 151. Conductive layer 151 may be made from materials conventionally used to form conductive layers for semiconductor devices. In an embodiment of the present invention, via hole 90 and trench 100 are filled with a layer of copper or copper alloy 151 in electrical contact with an underlying metal layer (not shown). Copper or copper alloy layer 151 is deposited in via hole 90 and trench 100 by, for example, electrochemical deposition (ECD), PVD, CVD, electro-plating technique, or a combination of these techniques to completely fill via hole 90 and trench 100 and form an overburden. It is understood that how the conductive layer 60 is deposited is a design choice dependent on the fabrication process being employed.

Figure 15:
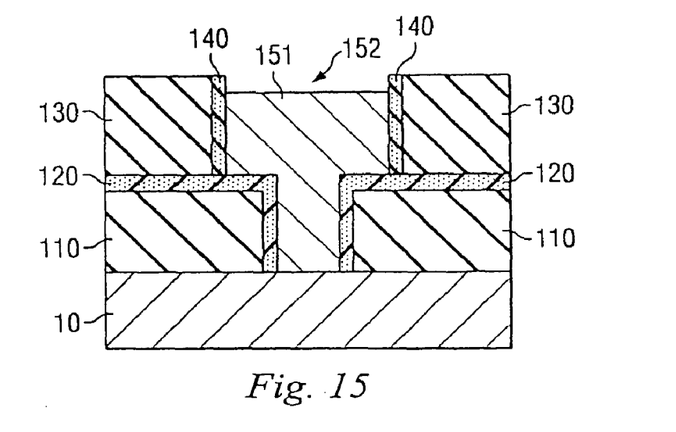
FIG. 15 is a schematic cross-sectional view of the structure of FIG. 14 showing the removal of the conductive layer above the second low-k dielectric layer to a predetermined depth below the second low-k dielectric layer to define a recess therebelow according to one embodiment of the present invention.

Referring now to FIG. 15, a schematic cross-sectional view of the structure of FIG. 14 shows the removal of the conductive layer of copper or copper alloy 151 from above the second low-k dielectric layer 130 to a predetermined depth below the second low-k dielectric layer 130 to define a recess 152. A significantly greater amount of conductive layer 151 is removed, without simultaneously removing significant amounts of second low-k dielectric layer 130 or first silicon carbide barrier layer 140, to form a relatively highly recessed conductive layer 151 within second low-k dielectric layer 130.

There are many ways to remove additional amounts of conductive layer 151 without removing a substantial portion of second low-k dielectric layer 130 or first silicon carbide barrier layer 140. The conductive layer 151 residing above second low-k dielectric layer 130 and below second low-k dielectric layer 130 are removed by either a conventional etching or polishing technique. In one embodiment of the present invention, a conventional CMP process is used to remove the conductive layer 151 using second low-k dielectric layer 130 and first silicon carbide barrier layer 140 as a polishing stop layer. In the CMP process, the second low-k dielectric layer 130 has a high polishing selectivity ratio relative to the conductive layer 151, that is, the polishing rate of the second low-k dielectric layer 130 can be considerably lower than that of the conductive layer 151. The polishing step continues to remove the conductive layer 151 to a predetermined depth below the second low-k dielectric layer 130 to define recess 152 therebelow. By adjusting the parameters applied during the CMP process, a highly recessed conductive layer 151 may be formed. The predetermined depth may be from about 300 angstroms to about 600 angstroms. A subsequently formed barrier layer will then be deposited in recess 152 to serve as a sealing layer so as to cover the top the of integrated circuit structure 2. It should be noted that conductive layer 151 should be recessed sufficiently deep into second low-k dielectric layer 130 to ensure that the subsequently deposited barrier layer will maintain a sufficient thickness to serve as a barrier layer and etch stop, even after the barrier layer has been polished and optionally cleaned.

Figure 16:
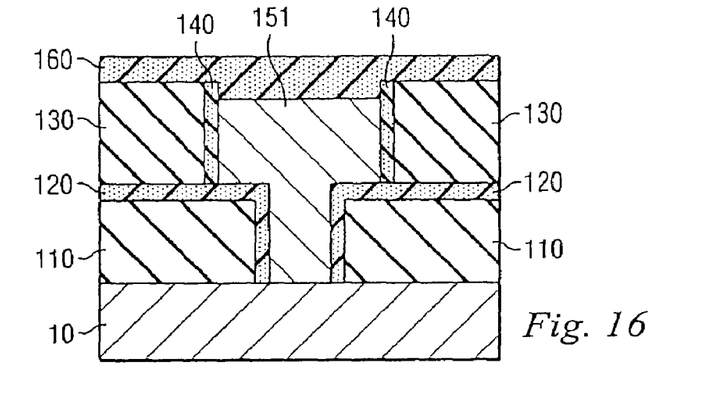
FIG. 16 is a schematic cross-sectional view of the structure of FIG. 15 showing a second barrier layer of silicon carbide formed to cover the recess and the upper surfaces of the second low-k dielectric layer and the first silicon carbide barrier layer according to one embodiment of the present invention.

FIG. 16 is a schematic cross-sectional view of the structure of FIG. 15 showing further processing. A second barrier layer of silicon carbide material 160 is formed to cover the recess 152 and the upper surfaces of the second low-k dielectric layer 130 and the first silicon carbide barrier layer 140 so as to completely encapsulate the inlaid conductive layer 151. As discussed above with reference to FIG. 2, second silicon carbide barrier layer 160 may be formed by one of several conventional processes. In one embodiment, second silicon carbide barrier layer 160 is formed using one of CVD process and PECVD process, formed at a thickness of about 200 angstroms to about 400 angstroms, at a temperature from about 350° C. to about 450° C. However, the thickness of second silicon carbide barrier layer 160 is variable depending on the specific stage of processing. Typically, the second silicon carbide barrier layer 160 has a thickness of about 200 angstroms to about 400 angstroms.

Figure 17:
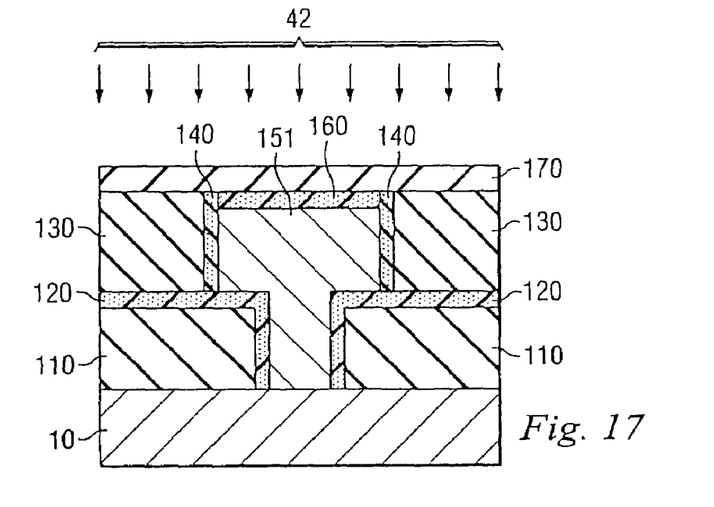
FIG. 17 is a schematic cross-sectional view of the structure of FIG. 16 showing the second barrier layer of silicon carbide exposed to a reactive oxidation treatment to form a layer of silicon oxide above the second low-k dielectric layer according to one embodiment of the present invention.

FIG. 17 is a schematic cross-sectional view of the structure of FIG. 16 showing the second barrier layer of silicon carbide 160 exposed to an oxidation treatment 42 to form a layer of silicon oxide 170 above second low-k dielectric layer 130. Conventional oxidation treatments may be employed and, in one embodiment, may include a reactive oxidation treatment performed at a temperature of from about 350° C. to about 450° C., at a pressure of from about 4.0 T to about 6.0 T, and a radio frequency power of from about 2000 W to about 3000 W.

Figure 18:
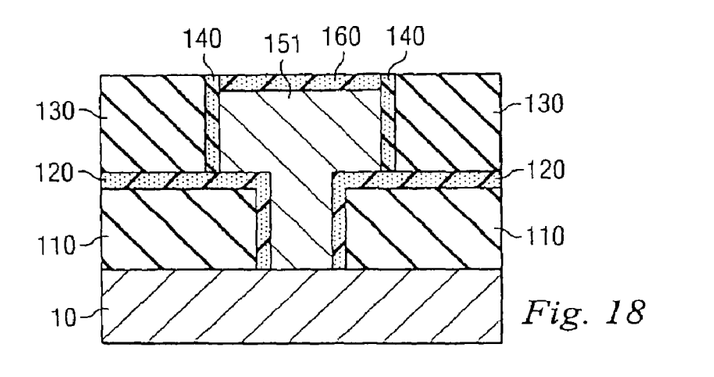
FIG. 18 is a schematic cross-sectional view of the structure of FIG. 17 showing the removal of the silicon oxide layer using an HF wet etching solution according to one embodiment of the present invention.

FIG. 18 is a schematic cross-sectional view of the structure of FIG. 17 showing the removal of silicon oxide layer 170. Silicon oxide layer 170 is removed by a conventional etching process, such as an hydrofluoric acid (HF) wet etching. In the resulting structure 2, first and second barrier layers of silicon carbide 140 and 160, respectively and etch stop layer 120 completely surround conductive layer 151. By repeating the above processes, additional interconnect structures can be fabricated to form metallization levels above structure 2. For instance, after forming a low-k dielectric layer above structure 2, a via (not shown) may be etched through it down to second silicon carbide barrier layer 160. The process steps described above may be repeated as necessary to generate a device with the desired number of metal levels.

Figure 19:
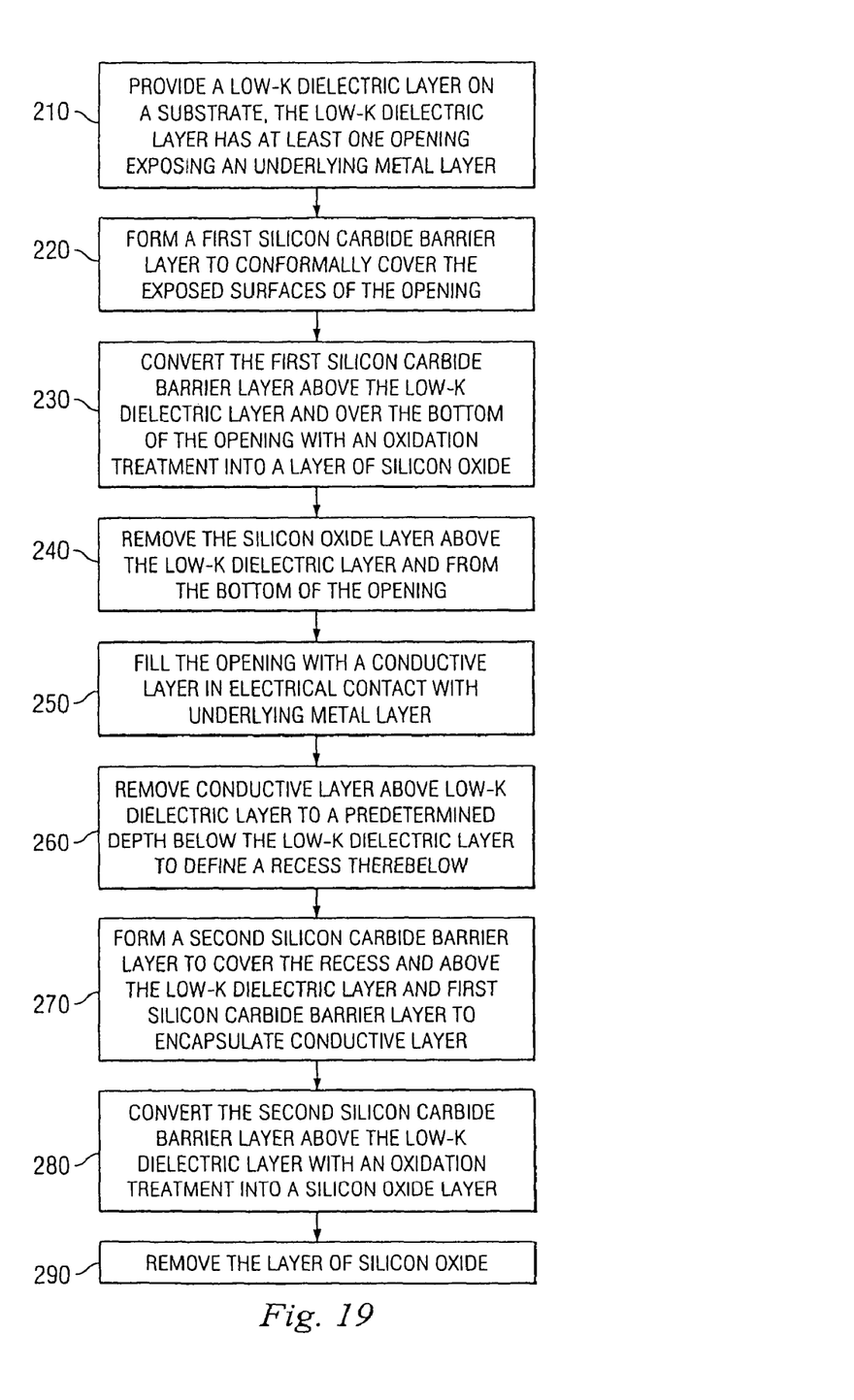
FIG. 19 is a flow chart diagram illustrating the steps of a method for forming a barrier layer in an integrated circuit structure according to one embodiment of the present invention.

Referring now to FIG. 19, a flow chart diagram illustrates the steps of a method for forming a barrier layer in an integrated circuit structure according to one embodiment of the present invention. The method starts at step 210 where a low-k dielectric layer on a substrate is provided; the low-k dielectric layer has at least one opening exposing an underlying metal layer. At step 220, a first silicon carbide barrier layer is formed to conformally cover the exposed surfaces of the opening. The method further continues at step 230 where the first silicon carbide barrier layer above the low-k dielectric layer and over the bottom of the opening is converted with an oxidation treatment into a layer of silicon oxide. At step 240, the silicon oxide layer is removed above the low-k dielectric layer and from the bottom of the opening. At step 250, the opening is filled with a conductive layer in electrical contact with the underlying metal layer. At step 260, the conductive layer is removed above the low-k dielectric layer to a predetermined depth below the low-k dielectric layer to define a recess therebelow. Further, at step 270, a second silicon carbide barrier layer is formed to cover the recess and above the low-k dielectric layer and first silicon carbide barrier layer so as to seal the top of the structure. At step 280, the second silicon carbide barrier layer above the low-k dielectric layer is converted with an oxidation treatment into a layer of silicon oxide. At step 290, the layer of silicon oxide is removed.

In the preceding methods, the interface between the conductive layer and the barrier layers is strengthened by forming silicon carbide-based barrier layers in an integrated circuit structure having feature dimensions less than 0.13 microns. Such methods thus enable the resulting device to have improved RC and diffusion inhibition properties, while improving that interface.

In the preceding detailed description, the present invention is described with reference to specifically exemplary embodiments thereof. It will, however, be evident that various modifications and changes may be made thereto without departing from the broader spirit and scope of the present invention, as set forth in the claims. The specification and drawings are, accordingly, to be regarded as illustrative and not restrictive. It is understood that the present invention is capable of using various other combinations and environments and is capable of changes or modifications within the scope of the inventive concept as expressed herein.

What is claimed is:

1. A method of making a semiconductor device, comprising:
    providing a carbon-doped silicon oxide dielectric layer overlying a substrate;
    forming a silicon carbide-based barrier layer to cover exposed surfaces of said carbon-doped silicon oxide dielectric layer;
    converting a portion of said silicon carbide-based barrier layer with an oxidation treatment into a layer of silicon oxide; and
    using said carbon-doped silicon oxide dielectric layer as a stop layer to remove said layer of silicon oxide.

2. A method of making an interconnect structure, comprising:
    forming a low-k dielectric layer on a substrate, said dielectric layer having at least one opening;
    forming a conformal first barrier layer over exposed surfaces of said opening;
    converting said first barrier layer above said dielectric layer and over the bottom of said opening into a second barrier layer, said second barrier layer having a removal rate associated with a first etchant that is greater than a removal rate of said first barrier layer associated with said first etchant; and
    using said first etchant to remove said second barrier layer.

3. The method of claim 2, further comprising:
    filling said opening with a conductive material; and
    removing a portion of said conductive material to form a recessed conductive layer within said dielectric layer.

4. The method of claim 3, further comprising:
forming a third barrier layer on surfaces of said recessed conductive layer, said first barrier layer and said dielectric layer;
converting said third barrier layer above said dielectric layer into a fourth barrier layer, said fourth barrier layer having a removal rate associated with a second etchant that is greater than a removal rate of said third barrier layer associated with said second etchant; and
using said second etchant to remove said fourth barrier layer whereby said third barrier layer encapsulating said recessed conductive layer.

5. A method of fabricating a dielectric barrier layer in an integrated circuit structure comprising:
providing a low-k dielectric layer on a substrate, said low-k dielectric layer having at least one opening exposing an underlying metal layer;
forming a first silicon carbide-based barrier layer to conformally cover exposed surfaces of said opening; and
converting said first silicon carbide-based barrier layer above said low-k dielectric layer and over the bottom of said opening with an oxidation treatment into a layer of silicon oxide.

6. The method of claim 5, wherein said low-k dielectric layer includes carbon-doped silicon oxide.

7. The method of claim 5, wherein said first silicon carbide-based barrier layer is formed, at least in part, using a chemical vapor deposition process or a plasma enhanced chemical vapor deposition process.

8. The method of claim 7, wherein said first silicon carbide-based barrier layer is formed to a thickness of from about 200 angstroms to about 400 angstroms.

9. The method of claim 7, wherein said first silicon carbide-based barrier layer is formed at a temperature of from about 350° C. to about 450° C.

10. The method of claim 5, wherein said oxidation treatment is a reactive oxidation treatment performed at a temperature of from about 350° C. to about 450° C., a pressure of from about 4.0 Torr to about 6.0 Torr, and a radio frequency power of from about 2000 W to about 3000 W.

11. The method of claim 10, wherein said oxidation treatment uses a gas mixture selected from the group consisting of $O_2$, $O_3$, and $N_2O$.

12. The method of claim 5, further comprising: removing said silicon oxide layer above said low-k dielectric layer and from the bottom of said opening.

13. The method of claim 12, wherein said silicon oxide layer is removed by an HF wet etching solution.

14. The method of claim 12, further comprising sequentially:
filling said opening with a conductive layer in electrical contact with said underlying metal layer;
removing said conductive layer above said low-k dielectric layer to a predetermined depth below said low-k dielectric layer to define a recess therebelow; and
forming a second silicon carbide-based barrier layer to cover said recess and above said low-k dielectric layer and said first silicon carbide-based barrier layer so as to encapsulate said conductive layer.

15. The method of claim 14, wherein said opening is filled with said conductive layer by electrochemical deposition.

16. The method of claim 14, wherein said conductive layer is removed by a chemical-mechanical planarization process.

17. The method of claim 14, wherein said second silicon carbide-based barrier layer is formed using at least one of either a chemical vapor deposition process or a plasma enhanced chemical vapor deposition process.

18. The method of claim 17, wherein said second silicon carbide-based barrier layer is formed to a thickness of from about 200 angstroms to about 400 angstroms.

19. The method of claim 17, wherein said second silicon carbide-based barrier layer is formed at a temperature of from about 350° C. to about 450° C.

20. The method of claim 12, further comprising sequentially:
filling said opening with a layer of copper or copper alloy in electrical contact with said underlying metal layer;
removing said layer of copper or copper alloy above said low-k dielectric layer to a predetermined depth below said low-k dielectric layer to define a recess therebelow; and
forming a second silicon carbide-based barrier layer to cover said recess and above said low-k dielectric layer and said first silicon carbide-based barrier layer so as to encapsulate said layer of copper or copper alloy.

21. The method of claim 20, wherein said opening is filled with said layer of copper or copper alloy by electrochemical deposition.

22. The method of claim 20, wherein said layer of copper or copper alloy is removed by a chemical-mechanical planarization process.

23. The method of claim 14, further comprising:
converting said second silicon carbide-based barrier layer above said low-k dielectric layer with an oxidation treatment into a layer of silicon oxide; and
removing said layer of silicon oxide.

24. The method of claim 23, wherein said oxidation treatment is a reactive oxidation treatment performed at a temperature of from about 350° C. to about 450° C., a pressure of from about 4.0 Torr to about 6.0 Torr, and a radio frequency power of from about 2000 W to about 3000 W.

25. The method of claim 24, wherein said oxidation treatment uses a gas mixture selected from the group consisting of $O_2$, $O_3$, and $N_2O$.

26. The method of claim 23, wherein said layer of silicon oxide is removed by an HF wet etching solution.

27. A method of fabricating a dielectric barrier layer in an integrated circuit structure comprising:
providing a low-k dielectric layer on a substrate, said low-k dielectric layer having at least one opening exposing an underlying metal layer;
forming a first silicon carbide-based barrier layer to conformally cover the exposed surfaces of said opening;
converting said first silicon carbide-based barrier layer above said low-k dielectric layer and over the bottom of said opening with an oxidation treatment into a layer of silicon oxide;
removing said silicon oxide layer above said low-k dielectric layer and from the bottom of said trench;
filling said opening with a conductive layer in electrical contact with said underlying metal layer;
removing said conductive layer above said low-k dielectric layer to a predetermined depth below said low-k dielectric layer to define a recess therebelow; forming a second silicon carbide-based barrier layer to cover said recess and above said low-k dielectric layer and said first silicon carbide-based barrier layer so as to encapsulate said conductive layer;
converting said second silicon carbide-based barrier layer above said low-k dielectric layer with an oxidation treatment into a layer of silicon oxide; and removing said layer of silicon oxide.

28. A method of fabricating a dielectric barrier layer in an integrated circuit structure, comprising:
provide a first low-k dielectric layer on a substrate having at least one opening, said opening having a via hole which exposes an underlying metal layer surrounded by said first low-k dielectric layer, said first low-k dielectric layer having an etch stop layer formed thereupon, and a trench over said via hole surrounded by a second low-k dielectric layer;
forming a first silicon carbide-based barrier layer to conformally cover the exposed surfaces of said opening; and
converting said first silicon carbide-based barrier layer above said second low-k dielectric layer, said etch stop layer, and over the bottom of said via hole with an oxidation treatment into a layer of silicon oxide.

29. The method of claim 28, wherein said etch stop layer includes silicon carbide-based material.

30. The method of claim 28, wherein said first low-k dielectric layer includes carbon-doped silicon oxide.

31. The method of claim 28, wherein said second low-k dielectric layer includes carbon-doped silicon oxide.

32. The method of claim 28, wherein said first silicon carbide-based barrier layer is formed using at least one of either a chemical vapor deposition process or a plasma enhanced chemical vapor deposition process.

33. The method of claim 32, wherein said first silicon carbide-based barrier layer is formed to a thickness of from about 200 angstroms to about 400 angstroms.

34. The method of claim 32, wherein said first silicon carbide-based barrier layer is formed at a temperature of from about 350° C. to about 450° C.

35. The method of claim 28, wherein said oxidation treatment is a reactive oxidation treatment performed at a temperature of from about 350° C. to about 450° C., a pressure of from about 4.0 Torr to about 6.0 Torr, and a radio frequency power of from about 2000 W to about 3000 W.

36. The method of claim 35, wherein said oxidation treatment uses a gas mixture selected from the group consisting of $O_2$, $O_3$, $N_2O$.

37. The method of claim 28, further comprising:
removing said silicon oxide layer above said second low-k dielectric layer and said etch stop layer, and from the bottom of said via hole.

38. The method of claim 37, wherein said silicon oxide layer is removed by an HF wet etching solution.

39. The method of claim 37, further comprising sequentially:
filling said via hole and said trench with a conductive layer in electrical contact with said underlying metal layer;
removing said conductive layer above said second low-k dielectric layer to a predetermined depth below said second low-k dielectric layer to define a recess therebelow; and
forming a second silicon carbide-based barrier layer to cover said recess and above said second low-k dielectric layer and said first silicon carbide-based barrier layer so as to encapsulate said conductive layer.

40. The method of claim 39, wherein said via hole and said trench is filled with said conductive layer by electrochemical deposition.

41. The method of claim 39, wherein said conductive layer is removed by a chemical-mechanical planarization process.

42. The method of claim 39, wherein said second silicon carbide-based barrier layer is formed using at least one of chemical vapor deposition process and plasma enhanced chemical vapor deposition process.

43. The method of claim 42, wherein said second silicon carbide-based barrier layer is formed to a thickness of from about 200 angstroms to about 400 angstroms.

44. The method of claim 42, wherein said second silicon carbide-based barrier layer is formed at a temperature of from about 350° C. to about 450° C.

45. The method of claim 37, further comprising sequentially:
filling said via hole and said trench with a layer of copper or copper alloy in electrical contact with said underlying metal layer;
removing said copper or copper alloy layer above said second low-k dielectric layer to a predetermined depth below said second low-k dielectric layer to define a recess therebelow; and
forming a second silicon carbide-based barrier layer to cover said recess and above said second low-k dielectric layer and said first silicon carbide-based barrier layer so as to encapsulate said copper or copper alloy layer.

46. The method of claim 45, wherein said via hole and said trench is filled with said layer of copper or copper alloy by electrochemical deposition.

47. The method of claim 45, wherein said layer of copper or copper alloy is removed by a chemical-mechanical planarization process.

48. The method of claim 45, further comprising:
converting said second silicon carbide-based barrier layer above said second low-k dielectric layer with an oxidation treatment into a layer of silicon oxide; and
removing said layer of silicon oxide.

49. The method of claim 48, wherein said oxidation treatment is a reactive oxidation treatment performed at a temperature of from about 350° C. to about 450° C., a pressure of from about 4.0 Torr to about 6.0 Torr, and a radio frequency power of from about 2000 W to about 3000 W.

50. The method of claim 49, wherein said oxidation treatment uses a gas mixture selected from the group consisting of $O_2$, $O_3$, $N_2O$.

51. The method of claim 48, wherein said layer of silicon oxide is removed by an Hf wet etching solution.

52. A method of fabricating a dielectric barrier layer in an integrated circuit structure, comprising:
providing a first low-k dielectric layer on a substrate having at least one opening, said opening including a via hole which exposes an underlying metal layer surrounded by said first low-k dielectric layer, said first low-k dielectric layer having an etch stop layer formed thereupon, and a trench over said via hole surrounded by a second low-k dielectric layer;
forming a first silicon carbide-based barrier layer to conformally cover the exposed surfaces of said opening;
converting said first silicon carbide-based barrier layer above said second low-k dielectric layer, said etch stop layer, and over the bottom of said via hole with an oxidation treatment into a layer of silicon oxide;
removing said silicon oxide layer above said second low-k dielectric layer and said etch stop layer, and from the bottom of said via hole;
filling said via hole and said trench with a conductive layer in electrical contact with said underlying metal layer;

removing said conductive layer above said second low-k dielectric layer to a predetermined depth below said second low-k dielectric layer to define a recess therebelow; forming a second silicon carbide-based barrier layer to cover said recess and above said second low-k dielectric layer and said first silicon carbide-based barrier layer so as to encapsulate said conductive layer;

converting said second silicon carbide-based barrier layer above said second low-k dielectric layer with an oxidation treatment into a layer of silicon oxide; and removing said layer of silicon oxide.

53. A method of forming a damascene structure, comprising:

forming a dielectric layer on a metal layer of a substrate, said dielectric layer having at least one opening exposing said metal layer;

forming a first barrier layer to conformally cover the exposed surfaces of said at least one opening;

providing an anisotropic treatment to convert said first barrier layer into a second barrier layer on the top surfaces of said at least one opening and over the bottom of said opening, said second barrier layer having a different etching rate from said first barrier layer;

removing said second barrier layer; and filling said at least one opening with a conductive material.

54. A method of making an interconnect structure, comprising:

forming a first low-k dielectric layer on a substrate, said first low-k dielectric layer having a first trench;

lining the exposed surfaces of said first trench with a conformal first barrier layer;

converting said first barrier layer above said first low-k dielectric layer and over the bottom of said first trench into a second barrier layer, such that the removal rate of said first barrier layer is higher than said second barrier layer when using a first prescribed etchant;

using said first prescribed etchant to remove said second barrier layer;

forming a first recessed conductive layer within said trench;

forming on said first recessed conductive layer a third barrier layer;

forming a second dielectric layer on said first low-k dielectric layer, said first barrier layer, and said third barrier layer;

etching a via into said second dielectric layer and said third barrier layer such that the surface of said first recessed conductive layer is exposed;

etching a second trench into said second dielectric layer;

lining said via, second trench and the upper surface of said second dielectric layer with a fourth barrier layer;

converting said fourth barrier layer above said second dielectric layer and over the bottom of said via and second trench into a fifth barrier layer, such that the removal rate of the fourth barrier layer is higher than said fifth barrier layer when using a second prescribed etchant;

using said second prescribed etchant to remove the fifth barrier layer;

forming a second recessed conductive layer within said via and second trench; and forming on said second recessed conductive layer a sixth barrier layer.

* * * * *